United States Patent [19]
Park et al.

[11] Patent Number: 5,940,696
[45] Date of Patent: Aug. 17, 1999

[54] METHOD OF MANUFACTURING A QUANTUM DIFFRACTION TRANSISTOR

[75] Inventors: Kyoung Wan Park, Taejon; Seong Jae Lee, Seoul; Min Cheol Shin, Taejon, all of Rep. of Korea

[73] Assignee: Electronics and Telecommunications Research Institute, Taejon-shi, Rep. of Korea

[21] Appl. No.: 08/932,616

[22] Filed: Sep. 17, 1997

[30] Foreign Application Priority Data

Oct. 28, 1996 [KR] Rep. of Korea ............... 96-48947

[51] Int. Cl.⁶ ............................................. H01L 21/338
[52] U.S. Cl. ................... 438/172; 438/167; 438/962
[58] Field of Search ............................. 438/22, 32, 142, 438/167, 171, 172, 962; 257/26, 28, 29; 250/396 R

[56] References Cited

U.S. PATENT DOCUMENTS 4,962,410 10/1990 Kriman et al. ......................... 357/22
5,191,216 3/1993 Henderson et al. .

OTHER PUBLICATIONS

Leburton et al., Tunable negative differential resistance in anti–dot diffraction field effect ransistors, Appl. Phys. Lett. 70 (5), pp. 634–636, Feb. 1997.

Park et al., Electron diffraction due to a reflection grating in a conducting wire, Appl. Phys. Lett. 71 (24), pp. 3555–3557, Dec. 1997.

*Primary Examiner*—Charles Bowers
*Assistant Examiner*—Keith Christianson
*Attorney, Agent, or Firm*—Cohen, Pontani, Lieberman & Pavane

[57] ABSTRACT

The present invention discloses a technique for applying diffraction characteristics of electrons to a two-dimensional electronic device to manufacture multi-functional transistor having various ON/OFF states. Method of manufacturing a quantum diffraction transistor according to the present invention is capable of adjusting the amplitude of drain current and having various ON/OFF states utilizing diffraction characteristics of electrons by interposing a reflection-type diffraction grating in a bent electron path. In the inventive multi-functional quantum diffraction transistor using a two dimensional electron gas in quantum well structure formed at a different species junction in a hetero-structure semiconductor device and having a bent electron path between the source electrode and the drain electrode with a reflection-type diffraction grating, the quantum diffraction effect of the electrons is used for the control of the diffracted drain current.

3 Claims, 2 Drawing Sheets

METHOD OF MANUFACTURING A QUANTUM DIFFRACTION TRANSISTOR

BACKGROUND OF THE INVENTION

1. Field of the Invention

The present invention relates to a device structure for applying diffraction characteristics of electrons to a high electron mobility transistor to manufacture multi-functional transistor having various ON/OFF states, and more particularly, to a method of manufacturing a quantum diffraction transistor capable of adjusting the amplitude of the drain current and having various ON/OFF states caused by diffraction effect of electrons by means of interposing a reflection type grating in an electron path.

2. Description of the Related Art

In general, diffraction characteristics of electrons mean that there is a possibility of finding the electrons at a region where the electrons can not travel by the classical movement of the scattering in conducting materials. The diffraction effect appears due to the wave property of the electrons, when the electrons pass through a certain type of the electric potential. Further, this diffraction effect of the electrons determines the intensity of the entire flow of the electrons in a field effect transistor structure, that is, the amplitude of the source-drain current. Thus a transistor using this phenomenon is so called as a quantum diffraction transistor.

It is therefore an object of the invention to provide a method of manufacturing a quantum diffraction transistor which is capable of achieving various multi-functional ON/OFF states, higher operational frequency, less gate threshold operational voltage, and higher transconductance and negative transconductances.

SUMMARY OF THE INVENTION

For the purpose of summarizing the present invention, the method for manufacturing the quantum diffraction transistor having source, drain, and gate electrodes is provided which comprises the steps of performing an etching patterning process for forming source and drain regions of the transistor, a bent electron path, and a quantum diffraction grating using a lithography technique. A structure of bent electron path including the quantum diffraction grating is then formed by etching a resulting substrate. An ohmic contact is formed in the source region and the drain region of the transistor. A cap layer is etched to prevent an undesirable current flow thereat. A metal gate of the transistor is then formed using metallization and lift-off techniques.

According to the present invention, it has superior advantages that various multi-functional ON/OFF states, higher operational frequency, less power consumption, lower gate threshold operational voltage, and higher transconductance and negative transconductances can be achieved. It can also be applied to the electronic devices to provide a ultra high speed, less power consumption, and multi-functional features, used to the next generation of ultra high speed data communication systems.

BRIEF DESCRIPTION OF THE DRAWINGS

The present invention will become more apparent upon a detailed description of the preferred embodiments for carrying out the invention as rendered below.

The operation of the embodiment of the present invention as discussed above will now be described in detail.

DETAILED DESCRIPTION OF THE INVENTION

Figure 1A:
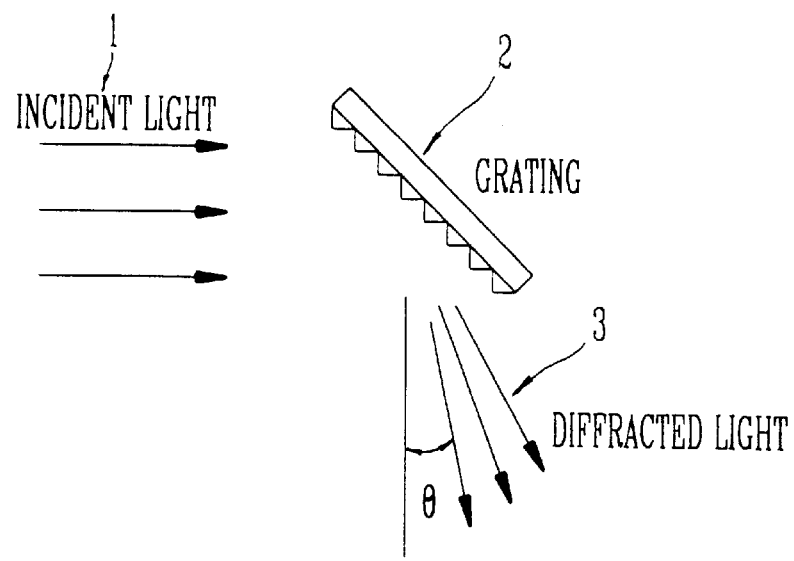
FIG. 1A is a structure representing a diffraction state caused by a grating.

Referring now to FIG. 1A, there is shown a structure representing a diffraction state caused by the grating. In the figure, an incident light 1 is diffracted to a predetermined angle (θ) by means of the grating 2. The intensity of the diffracted light appearing at a screen, not shown in the drawing, can be defined by the equation as follow:

$$I = Io \left[ \frac{\mathrm{Sin}\beta}{\beta} \right]^2 \left[ \frac{\mathrm{Sin}N\gamma}{N\mathrm{Sin}\gamma} \right]^2$$

where β is ½ kb Sin θ, γ is ½khSin θ, k is an wave vector of the light, b is an width of reflection slits, h is the distance between the slits, N is the number of the slits and θ is diffraction angle.

Figure 1B:
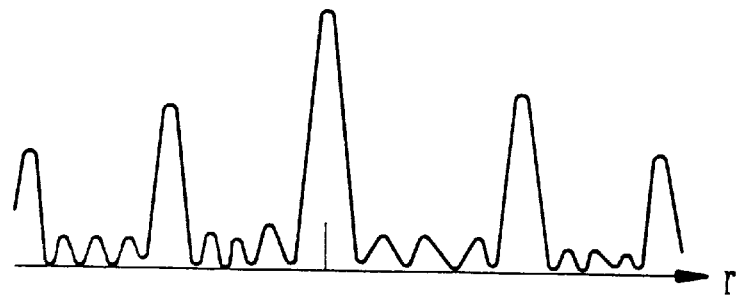
FIG. 1B is an waveform diagram representing the intensity of the light wave measured at a screen according to the γ value.

FIG. 1B is an waveform diagram representing the intensity of the diffracted light measured at a screen according to a γ value. Here, it is noted that the equation above is based on the theory of Fraunhofer diffraction formula.

Figure 2:
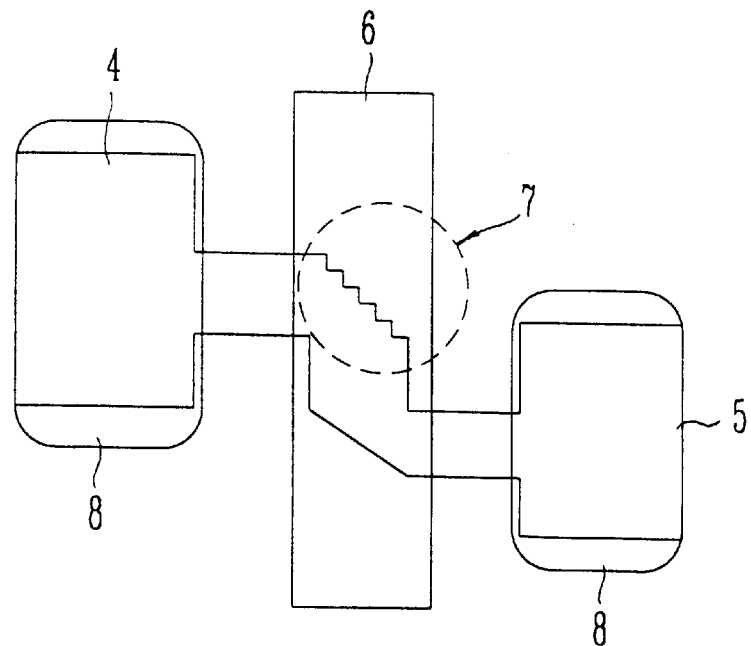
FIG. 2 is a structure illustrating a quantum diffraction transistor according to the present invention.

FIG. 2 is a structure illustrating a quantum diffraction transistor according to the present invention, in which a gate electrode 6 between a source electrode 4 and a drain electrode 5 is formed with a quantum grating structure 7.

In the figure, an electrical reflection grating 7 is composed of a plurality of electrical reflective potential walls. Each of the electrical reflective potential walls comprises a pair of the electrical reflective potential walls whose reflection angles are greatly different. In order to adjust the density of electrons in a electron path, a gate of metal is attached on the upper portion of the electron path.

The diffraction phenomenon occurred when the electron wave is reflected at the electron grating can be expressed by the same method as the equation described above. Here, the diffraction condition is adjusted with the γ value as shown in FIG. 1. Further, in case that the diffraction angle (θ), the width (b), and distance (h) of the reflective potential walls are constant, the γ value is determined in accordance with the wave vector of the electrons (k). Since the magnitude of the wave vector of the electrons is determined depending upon the density of the electrons and the density of the electrons is determined depending on the voltage of the metal gate, the diffraction condition of the electrons is determined in accordance with the gate voltage, so that the amplitude of the diffraction current is adjusted by the gate voltage.

Now, the method of manufacturing the quantum diffraction transistor according to the present invention will be described hereinafter.

An etching pattern for forming source and drain regions of the transistor, a bent electron path, and a grating is formed using a lithography technique. The resulting substrate is then etched, and the bent electron path including the grating is formed. Ohmic contacts 8 are then formed in the source and drain regions of the transistor. A metal gate of an Al or Ti/Au is formed on the electron path using lithography, metalization, and lift-off techniques to cover the electron path and the grating.

Figure 3:
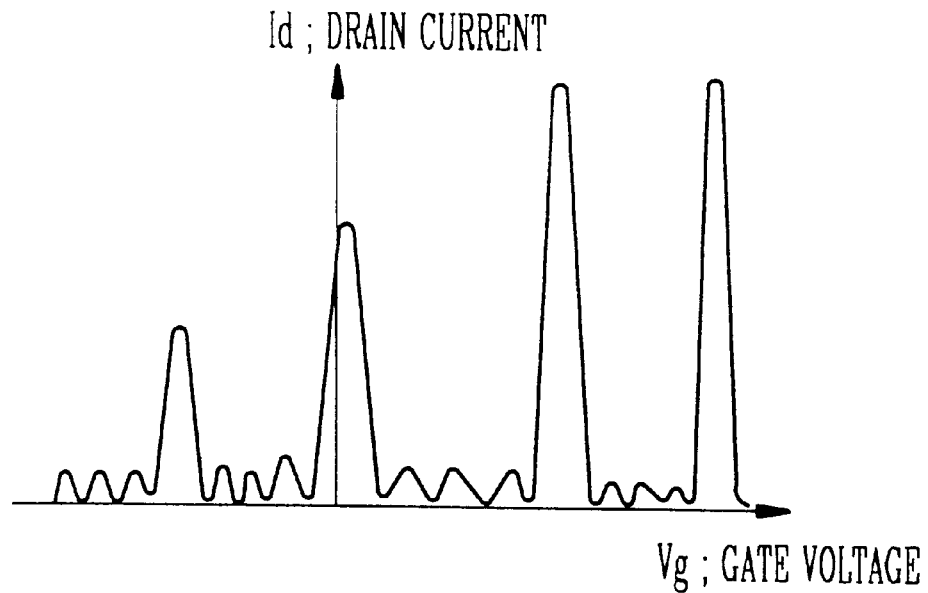
FIG. 3 is an waveform diagram representing the change of a drain current relative to a gate voltage of the quantum diffraction transistor according to the present invention.

FIG. 3 is an waveform diagram representing the change of a drain current relative to a gate voltage of the quantum diffraction transistor according to the present invention.

In the drawing, it shows characteristics that the amplitude of drain current due to the quantum diffraction phenomenon of the electrons is different from that of the classical transistor in the prior art. In an ideal case, there are various ON/OFF characteristics at the drain current. Further, in addition to this various multi-functional characteristic of the transistor mentioned above, it shows another characteristics of the high transconductance and negative transconductance at a certain region at which the gate voltage is normally maintained.

In the quantum diffraction phenomenon of the electrons, the electrons should be wavily moved so as not to lose an interference nature thereof, while the electrons pass between the source electrode and the drain electrode of the transistor. However, in the solid state, the interference nature of the electrons is lost due to the inelastic collisions therebetween. Therefore, in order to obtain the operational feature of the transistor by means of the quantum mechanical phenomenon, it is necessary either to reduce a primary factor which arises the inelastic collisions, or to reduce the size of the transistor so that the electrons can quantum-mechanically interfere each other before occurrence of the inelastic collision of the electrons.

Figure 4:
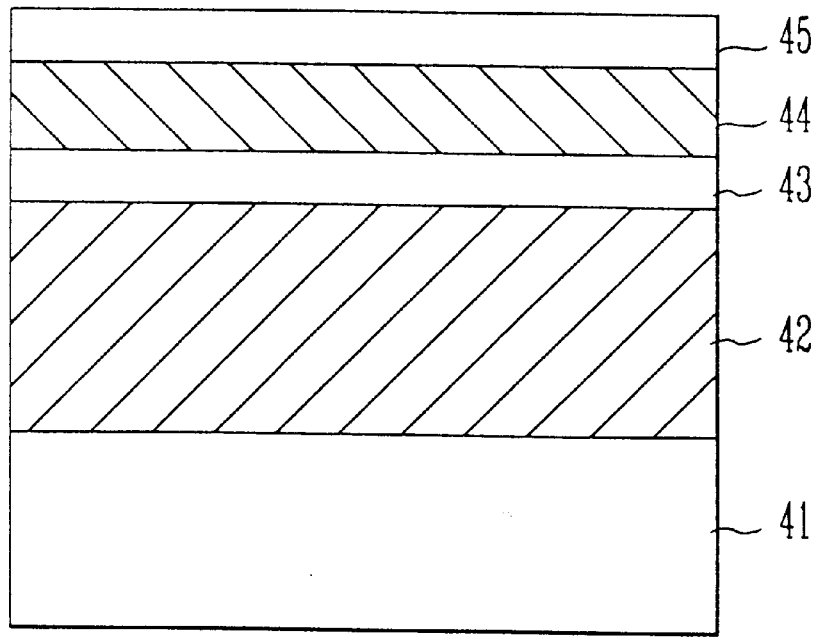
FIG. 4 is a sectional view of the quantum diffraction transistor according to the present invention.

FIG. 4 is a sectional view of the semiconductor substrate applied to the present invention, in which a two-dimensional electron gas layer is formed by depositing a GaAs buffer layer 42 and an AlGaAs spacer layer 43 on a semi-insulating GaAs substrate 41 using a Molecular Beam Epitaxial growth method or a Metal Organic Chemical Vapor Deposition method, an AlGaAs barrier 44 deposited with a silicon dopant material and a GaAs cap layer 45 are successively formed.

As fully described above, in the present invention it has superior advantages that various multi-functional ON/OFF states, higher operational frequency, less power consumption, lower gate threshold operational voltage, and higher transconductance and negative transconductances can be achieved. Further, the present invention can also be applied to the electronic devices to provide a ultra high speed, less power consumption, multi-functional features, used to the next generation of ultra high speed data communication system.

The present invention has been described with reference to a particular embodiment in connection with a particular application. Those having ordinary skill in the art and access to the teachings of the present invention will recognize additional modifications and applications within the scope thereof. It is therefore intended by the appended claims to cover any and all such applications, modifications, and embodiments within the scope of the present invention.

What is claimed is:

1. A method for manufacturing a quantum diffraction transistor having source, drain, and gate electrodes, a bent electron path, and a quantum diffraction grating, the method comprising the steps of:

forming an etching pattern of resist on a base substrate for source and drain regions, the electron path to be bent, and the quantum diffraction grating by using a lithography technique, wherein the electron path to be bent is located between the source region and the drain region, and the quantum diffraction grating is located on the bent electron path;

etching the base substrate to form the source electrode the drain electrode, and the bent electron path including the quantum diffraction grating;

forming an ohmic contact in the source electrode and the drain electrode of said transistor;

etching a cap layer to prevent an undesirable current flow thereat; and forming the gate electrode of said transistor using metallization and lift-off techniques.

2. The method in accordance with claim 1, wherein the cap layer is formed with GaAs.

3. The method in accordance with claim 1, wherein the gate electrode of said transistor comprises one of Al and Ti/Au.

* * * * *